United States Patent
Wang et al.

(10) Patent No.: US 7,193,436 B2
(45) Date of Patent: Mar. 20, 2007

(54) FAST PROCESSING PATH USING FIELD PROGRAMMABLE GATE ARRAY LOGIC UNITS

(75) Inventors: Man Wang, Sunnyvale, CA (US); Suhail Zain, San Ramon, CA (US)

(73) Assignee: KLP International Ltd., Santa Clara, CA (US)

( * ) Notice: Subject to any disclaimer, the term of this patent is extended or adjusted under 35 U.S.C. 154(b) by 144 days.

(21) Appl. No.: 11/108,927

(22) Filed: Apr. 18, 2005

(65) Prior Publication Data

US 2006/0232296 A1  Oct. 19, 2006

(51) Int. Cl.
  G06F 7/38   (2006.01)
  H03K 19/177 (2006.01)
(52) U.S. Cl. ............................ 326/40; 326/38; 326/41
(58) Field of Classification Search ................. 326/38, 326/40–41
  See application file for complete search history.

(56) References Cited

U.S. PATENT DOCUMENTS

| | | | |
|---|---|---|---|
| 3,634,929 A | 1/1972 | Yoshida et al. |
| 4,322,822 A | 3/1982 | McPherson |
| 4,488,262 A | 12/1984 | Basire et al. |
| 4,490,900 A | 1/1985 | Chiu |
| 4,502,208 A | 3/1985 | McPherson |
| 4,507,757 A | 3/1985 | McElroy |
| 4,543,594 A | 9/1985 | Mohsen et al. |
| 4,546,273 A | 10/1985 | Osman |
| 4,599,705 A | 7/1986 | Holmberg et al. |
| 4,613,886 A | 9/1986 | Chwang |
| 4,677,742 A | 7/1987 | Johnson |
| 4,758,745 A | 7/1988 | El Gamal et al. |
| 4,758,986 A | 7/1988 | Kuo |
| 4,794,562 A | 12/1988 | Kato et al. |
| 4,823,181 A | 4/1989 | Mohsen et al. |
| 4,870,302 A | 9/1989 | Freeman |
| 4,876,220 A | 10/1989 | Mohsen et al. |

(Continued)

FOREIGN PATENT DOCUMENTS

EP   0 295 935   12/1988

(Continued)

OTHER PUBLICATIONS

U.S. Appl. No. 09/629,570, filed Jun. 21, 2005 Bourassa et al.

(Continued)

*Primary Examiner*—Anh Q. Tran
(74) *Attorney, Agent, or Firm*—Perkins Coie LLP

(57) ABSTRACT

The described embodiments relate to the general area of Field Programmable Gate Arrays (FPGAs), and, in particular, to the architecture and the structure of the building blocks of the FPGAs. Proposed logic units, as separate units or a chain of units, which are mainly comprised of look-up tables, multiplexers, and latches, implement different mathematical and logical functions. Having two outputs, the embodiments of the logic unit can operate in a split mode and perform two separate logic and/or arithmetic functions at the same time. Chains of the proposed logic units, wherein every other unit is clocked by one of the two half clock cycles and utilizes local interconnections instead of traditional routing channels, add to efficiency and speed, and reduce required real estate.

20 Claims, 9 Drawing Sheets (Master Diagram)

U.S. PATENT DOCUMENTS

| | | | |
|---|---|---|---|
| 4,899,205 | A | 2/1990 | Hamdy et al. |
| 4,943,538 | A | 7/1990 | Mohsen et al. |
| 4,962,342 | A | 10/1990 | Mead et al. |
| 5,138,410 | A | 8/1992 | Takebuchi |
| 5,150,179 | A | 9/1992 | Gill |
| 5,303,185 | A | 4/1994 | Hazani |
| 5,304,871 | A | 4/1994 | Dharmarajan et al. |
| 5,323,342 | A | 6/1994 | Wada et al. |
| 5,412,244 | A | 5/1995 | Hamdy et al. |
| 5,455,525 | A | 10/1995 | Ho et al. |
| 5,477,499 | A | 12/1995 | Van Buskirk et al. |
| 5,496,756 | A | 3/1996 | Sharma et al. |
| 5,576,568 | A | 11/1996 | Kowshik |
| 5,578,848 | A | 11/1996 | Kwong et al. |
| 5,586,270 | A | 12/1996 | Rotier et al. |
| 5,587,603 | A | 12/1996 | Kowshik |
| 5,600,265 | A | 2/1997 | El Gamal et al. |
| 5,650,336 | A | 7/1997 | Eriguchi et al. |
| 5,675,541 | A | 10/1997 | Leterrier |
| 5,675,547 | A | 10/1997 | Koga |
| 5,745,417 | A | 4/1998 | Kobayashi et al. |
| 5,781,032 | A | 7/1998 | Bertolet et al. |
| 5,784,636 | A | 7/1998 | Rupp |
| 5,825,200 | A | 10/1998 | Kolze |
| 5,825,201 | A | 10/1998 | Kolze |
| 5,880,512 | A | 3/1999 | Gordon et al. |
| 5,889,411 | A | 3/1999 | Chaudhary |
| 5,892,962 | A | 4/1999 | Cloutier |
| 5,909,049 | A | 6/1999 | McCollum |
| 5,929,482 | A | 7/1999 | Kawakami |
| 5,949,712 | A | 9/1999 | Rao et al. |
| 5,986,931 | A | 11/1999 | Caywood |
| 5,986,939 | A | 11/1999 | Yamada |
| 6,016,268 | A | 1/2000 | Worley |
| 6,031,761 | A | 2/2000 | Ghilardelli et al. |
| 6,034,893 | A | 3/2000 | Mehta |
| 6,040,968 | A | 3/2000 | Duvvury et al. |
| 6,044,012 | A | 3/2000 | Rao et al. |
| 6,047,243 | A | 4/2000 | Bang |
| 6,055,205 | A | 4/2000 | Rao et al. |
| 6,064,225 | A | 5/2000 | Andrews et al. |
| 6,064,595 | A | 5/2000 | Logie et al. |
| 6,077,719 | A | 6/2000 | Koike |
| 6,084,428 | A | 7/2000 | Kolze et al. |
| 6,097,077 | A | 8/2000 | Gordon et al. |
| 6,153,463 | A | 11/2000 | Wei et al. |
| 6,157,568 | A | 12/2000 | Schmidt |
| 6,166,954 | A | 12/2000 | Chern |
| 6,177,830 | B1 | 1/2001 | Rao |
| 6,198,652 | B1 | 3/2001 | Kawakubo |
| 6,214,666 | B1 | 4/2001 | Mehta |
| 6,215,140 | B1 | 4/2001 | Reisinger et al. |
| 6,218,274 | B1 | 4/2001 | Komatsu |
| 6,232,631 | B1 | 5/2001 | Schmidt et al. |
| 6,236,229 | B1 | 5/2001 | Or-Bach |
| 6,249,809 | B1 | 6/2001 | Bro |
| 6,282,123 | B1 | 8/2001 | Mehta |
| 6,294,809 | B1 | 9/2001 | Logie |
| 6,297,103 | B1 | 10/2001 | Ahn et al. |
| 6,304,666 | B1 | 10/2001 | Warren et al. |
| 6,337,250 | B2 | 1/2002 | Furuhata |
| 6,351,428 | B2 | 2/2002 | Forbes |
| 6,421,293 | B1 | 7/2002 | Candelier et al. |
| 6,431,456 | B2 | 8/2002 | Nishizawa et al. |
| 6,445,619 | B1 | 9/2002 | Mihnea et al. |
| 6,456,535 | B2 | 9/2002 | Forbes et al. |
| 6,459,634 | B1 | 10/2002 | Sher |
| 6,476,636 | B1 | 11/2002 | Lien et al. |
| 6,515,509 | B1 | 2/2003 | Baxter |
| 6,556,481 | B1 | 4/2003 | Hsu et al. |
| 6,602,729 | B2 | 8/2003 | Lin |
| 6,633,182 | B2 | 10/2003 | Pileggi et al. |
| 6,650,143 | B1 | 11/2003 | Peng |
| 6,674,670 | B2 | 1/2004 | Jeung |
| 6,678,646 | B1 | 1/2004 | McConnell et al. |
| 6,700,151 | B2 | 3/2004 | Peng |
| 6,753,590 | B2 | 6/2004 | Fifield et al. |
| 6,754,881 | B2 | 6/2004 | Kuhlmann et al. |
| 6,777,757 | B2 | 8/2004 | Peng et al. |
| 6,862,205 | B2 | 3/2005 | Agata et al. |
| 2001/0003374 | A1 | 6/2001 | Bohmer et al. |
| 2003/0218920 | A1 | 11/2003 | Harari |
| 2004/0155677 | A1* | 8/2004 | Lewis et al. ................. 326/40 |
| 2005/0275427 | A1* | 12/2005 | Wang et al. ................. 326/41 |

FOREIGN PATENT DOCUMENTS

JP 61292295 12/1986

OTHER PUBLICATIONS

Wu, E.W. et al; Voltage-Dependent Voltage-Acceleration of Oxide Breakdown for Ultra-Thin Oxides; IEEE, 2000, pp. 1-14, month not available.

Sune, Jordi et al; Post Soft Breakdown Conduction in SiO2 Gate Oxides; IEEE, 2000, pp. 1-4, no month.

DeGraaf, C., et al, A Novel High-Density Low-Cost Diode Programmable Read Only Memory, IEEE, 1996, pp. 7.6.1-7.6.4, no month.

Rasras, Mahmoud et al; Substrate Hole Current Origin After Oxide Breakdown; IEEE, 2000, pp. 1-4, no month.

Lombardo, S. et al; Softening of Breakdown in Ultra-Thin Gate Oxide nMOSFET's at Low Inversion Layer Density; 39th Annual International Reliability Physics Symposium; Orlando, FL 2001, pp. 163-169, no month.

Miranda, Enrique et al; Analytic Modeling of Leakage Current Through Multiple Breakdown Paths in SiO2 Films; 39th Annual International Reliability Physics Symposium; Orlando, FL 2001, pp. 369-379, no month.

* cited by examiner

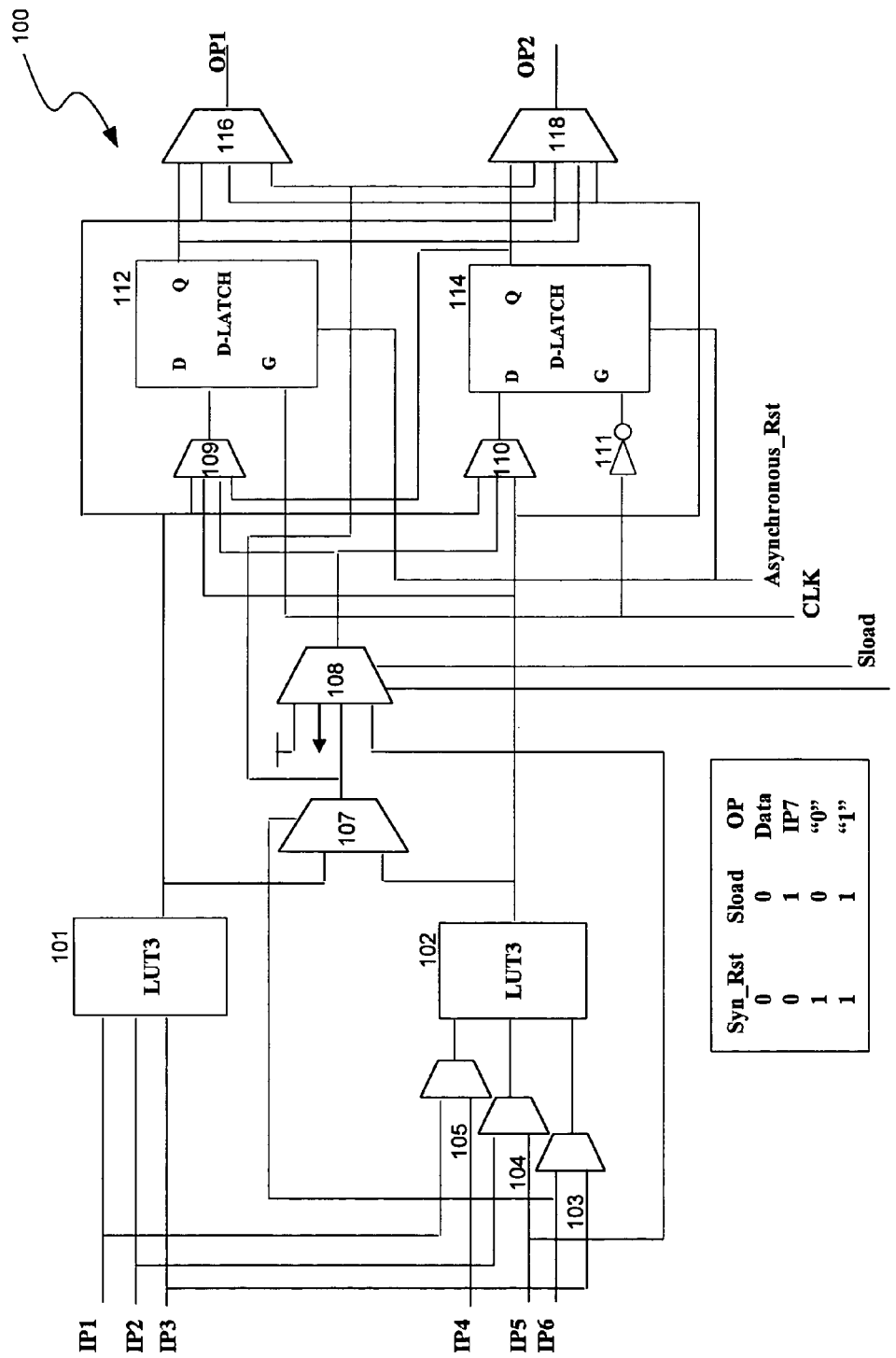
*FIG. 1* (Master Diagram)

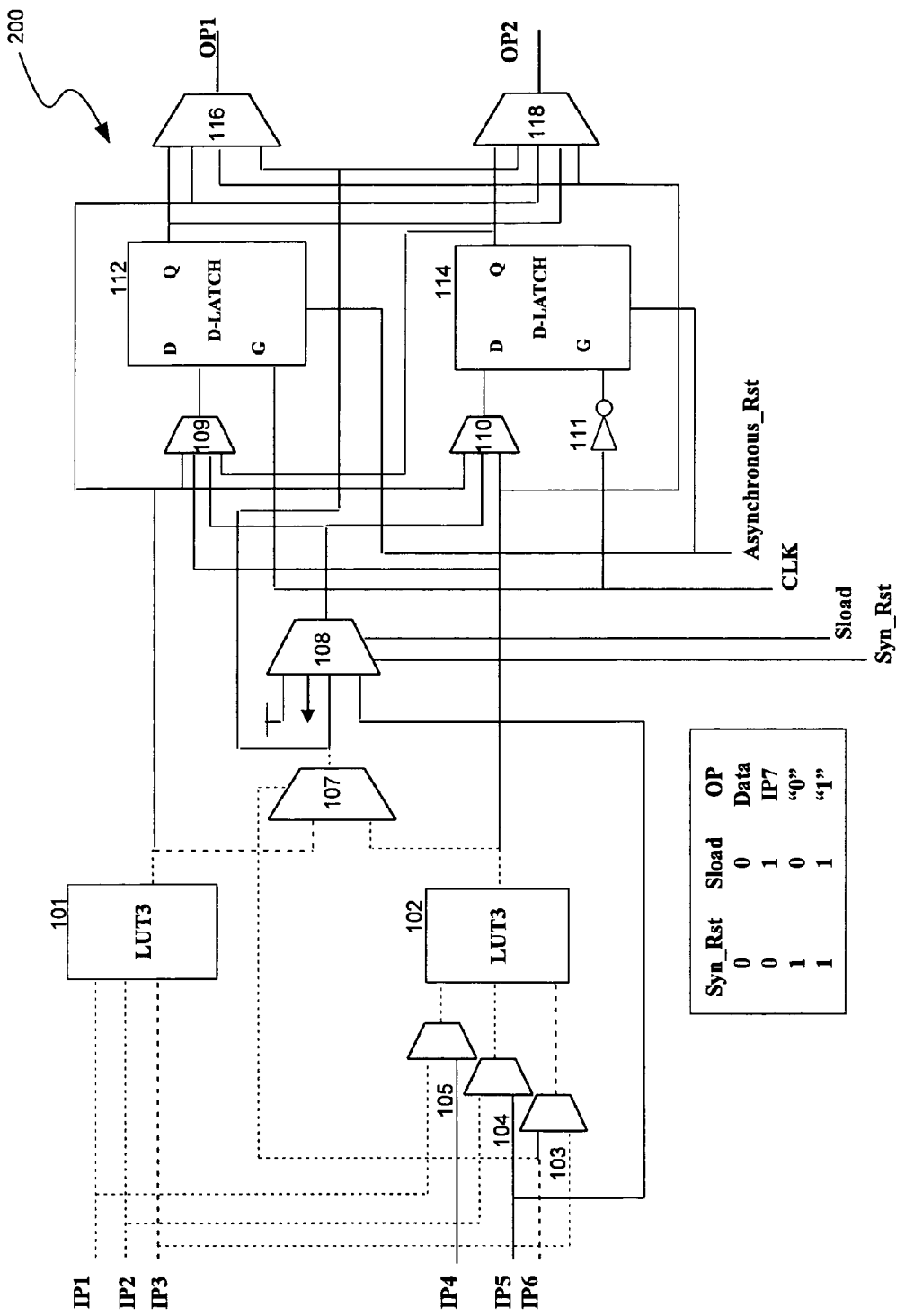
FIG. 2 (LUT4 Mode)

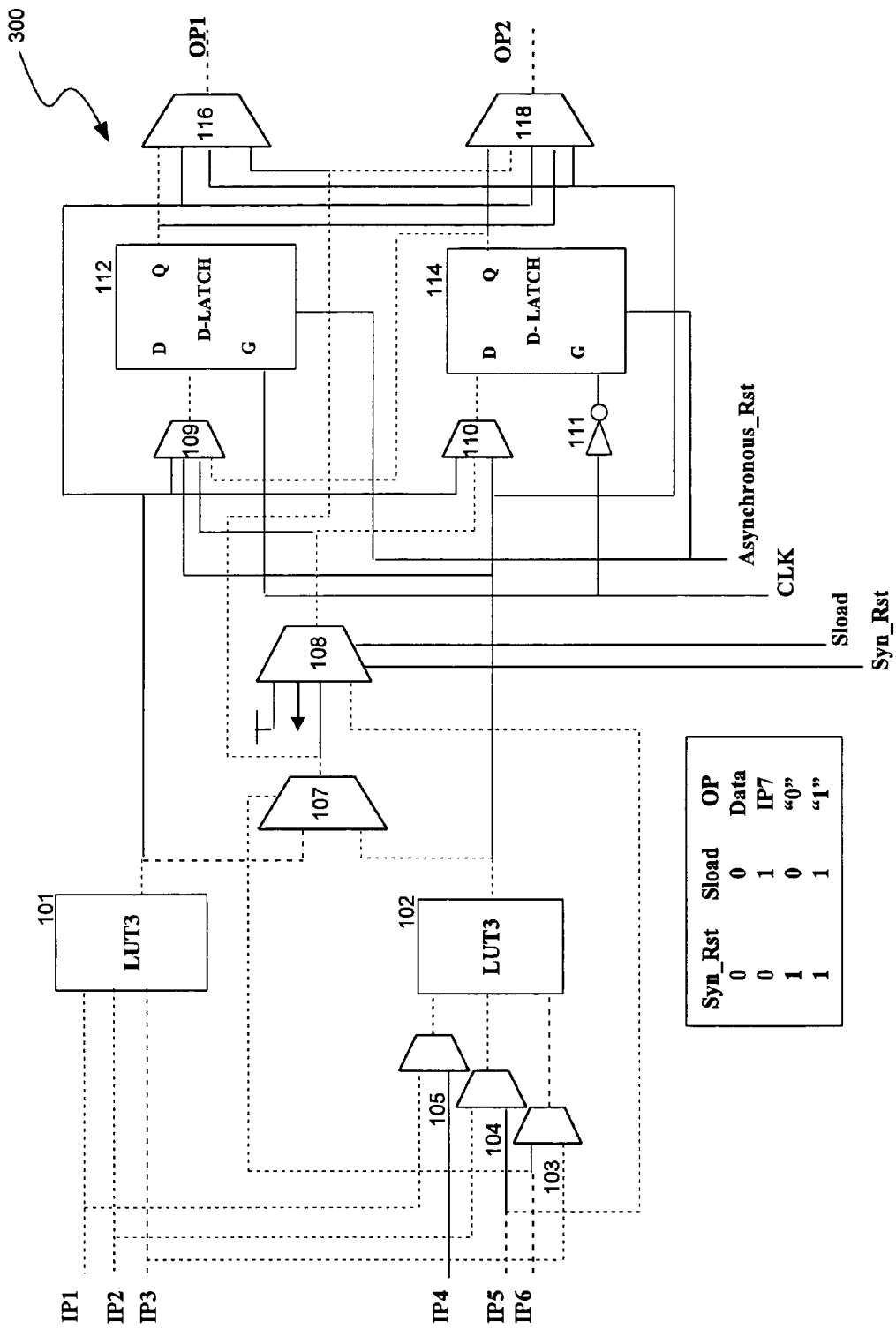
FIG. 3 *(LUT4 Mode and Register Packing)*

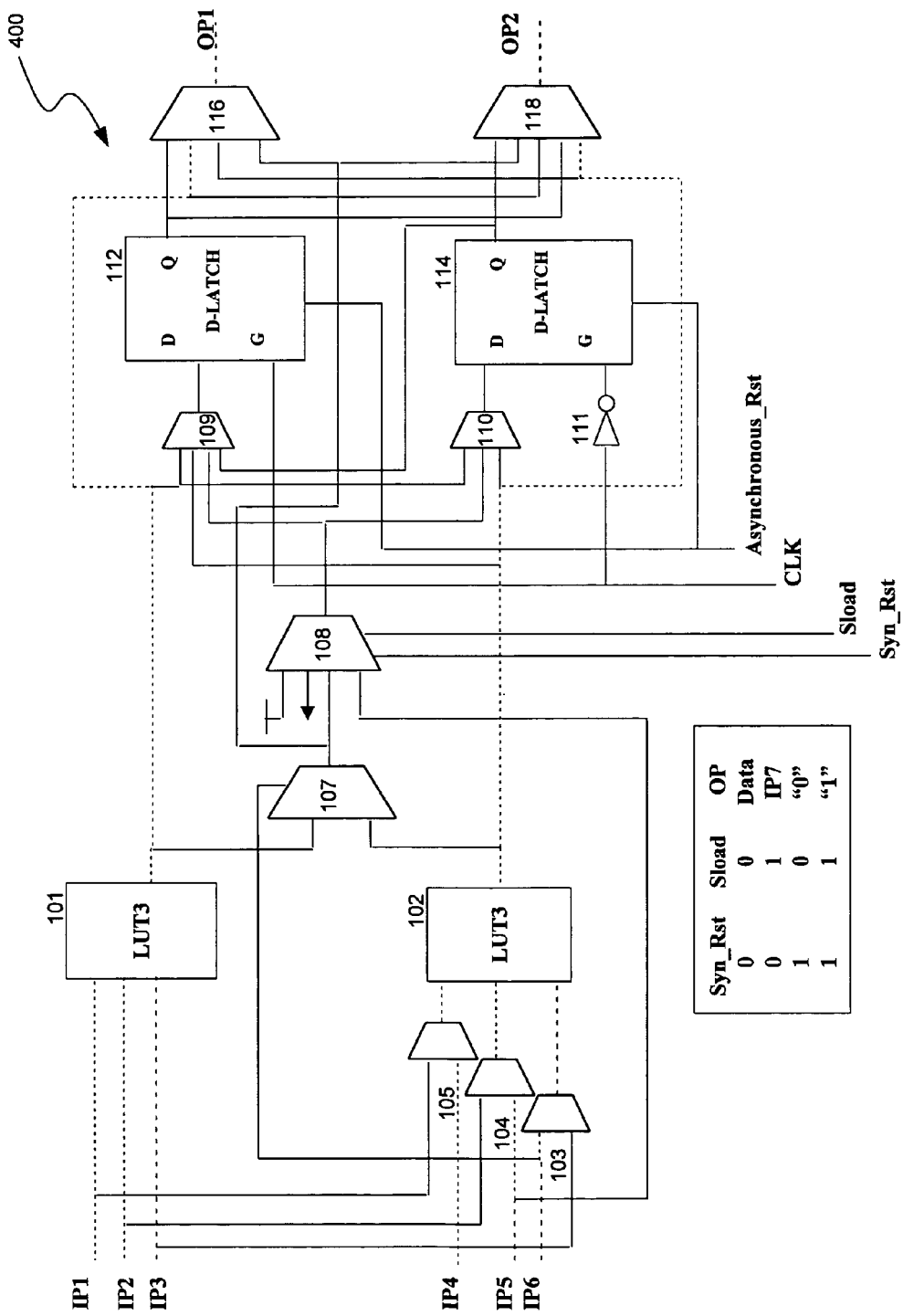
*FIG. 4* (Split Mode: 2 Combinational LUT3)

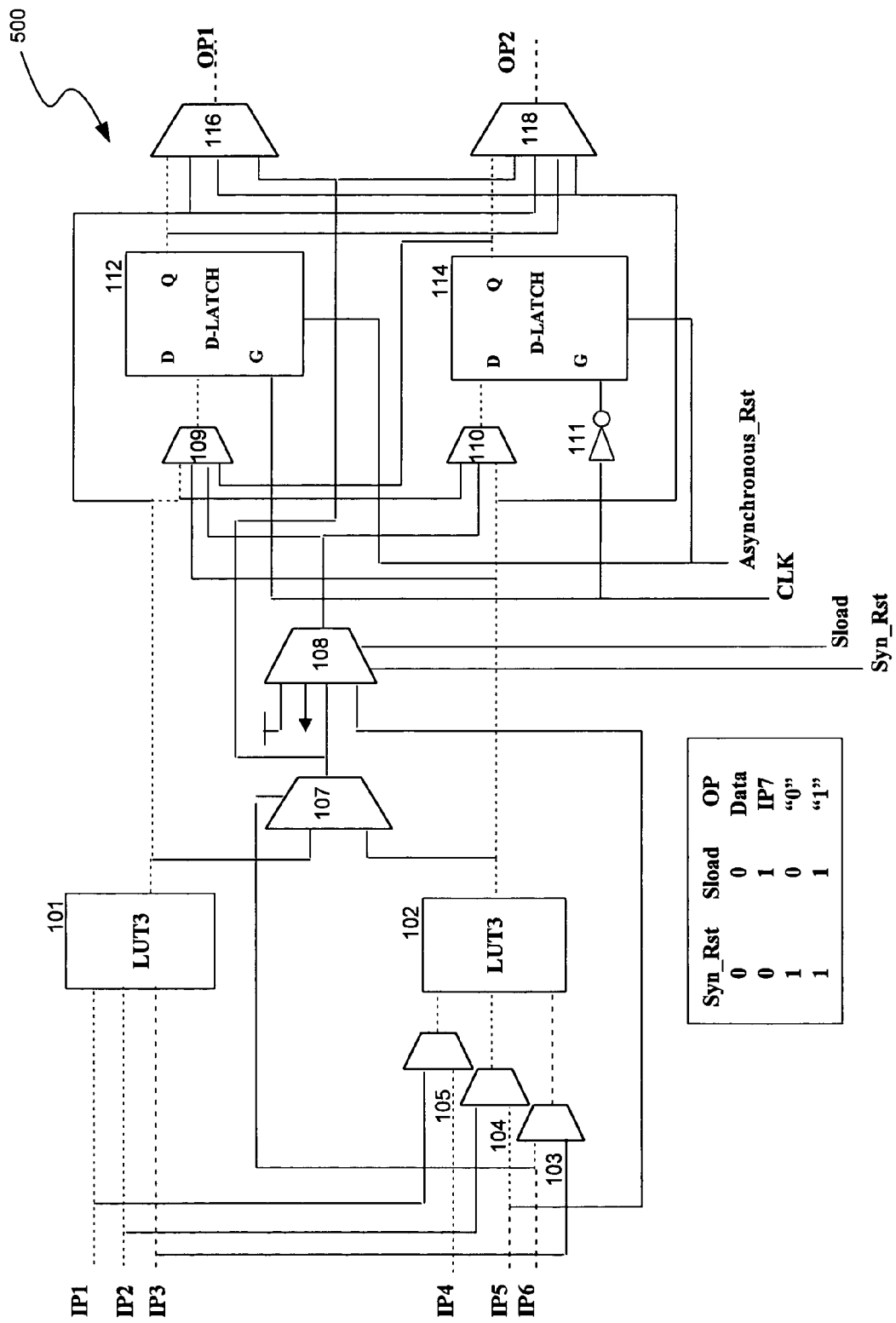
FIG. 5 (Split Mode: 2 LUT3 with D-Latch)

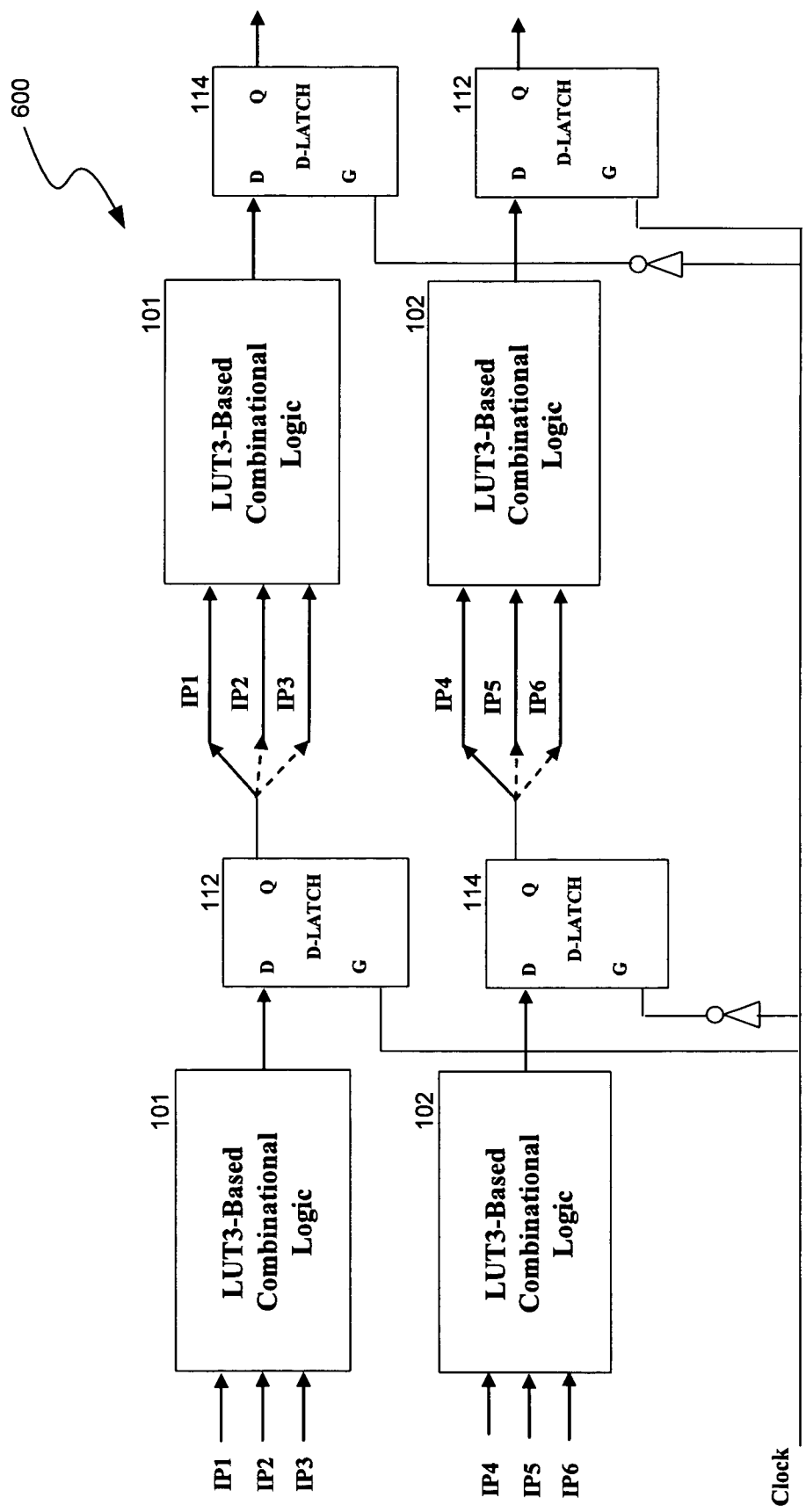
FIG. 6 (Based on Split Mode with D-Latch)

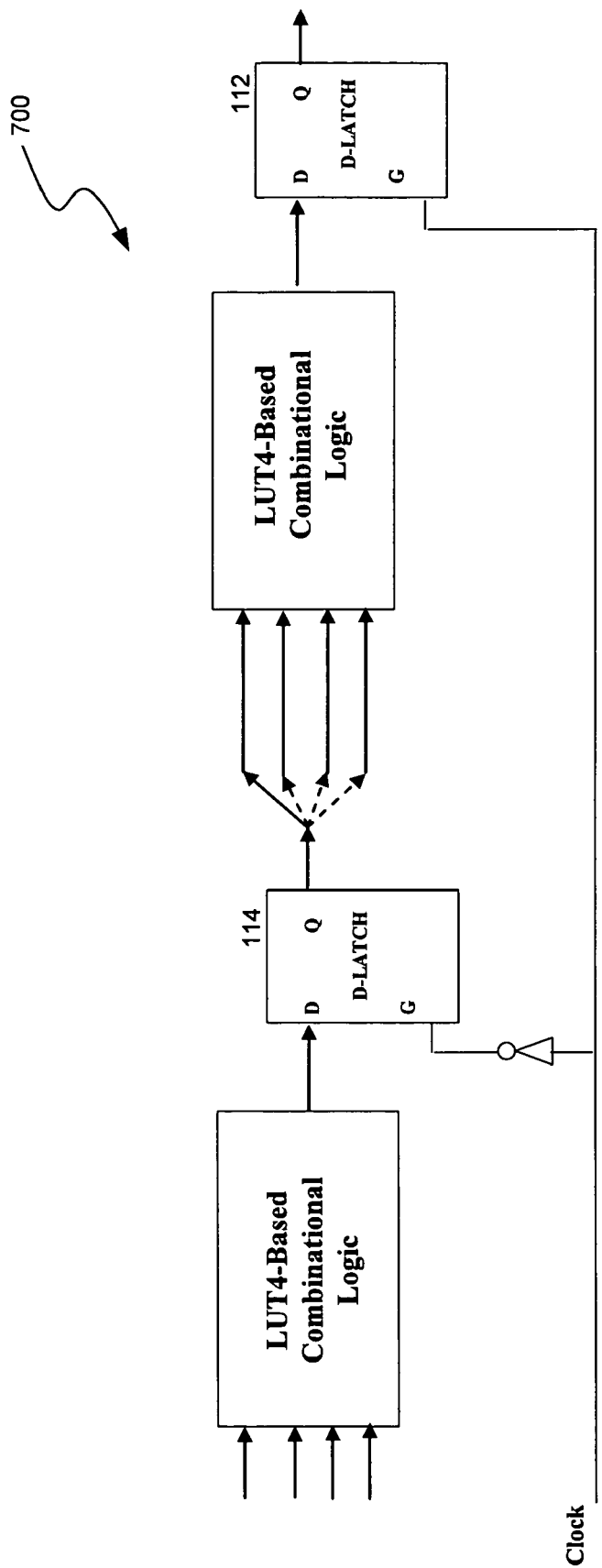
FIG. 7 *(Based on LUT4 with D-Latch)*

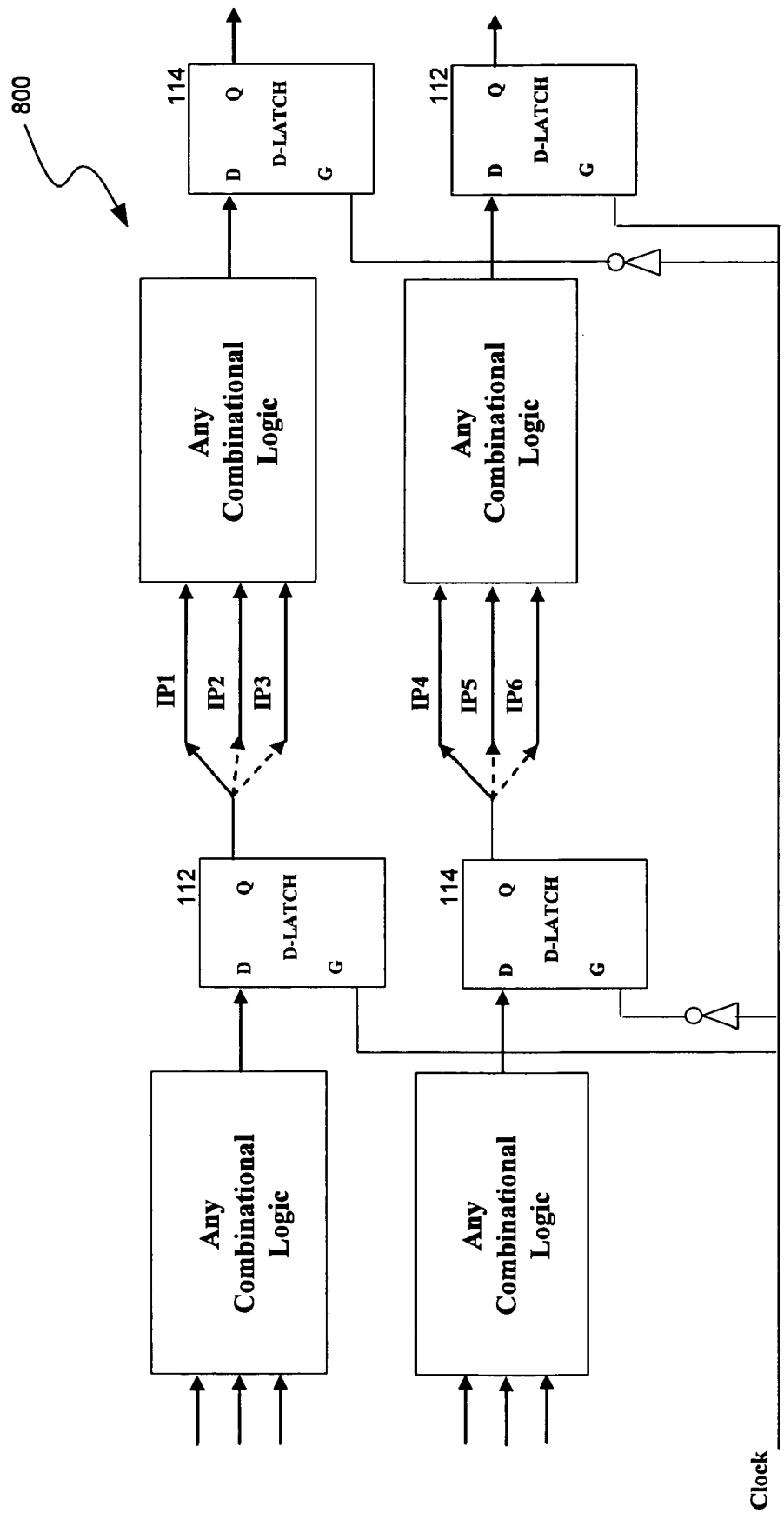
FIG. 8 (Based on Split Mode with D-Latch)

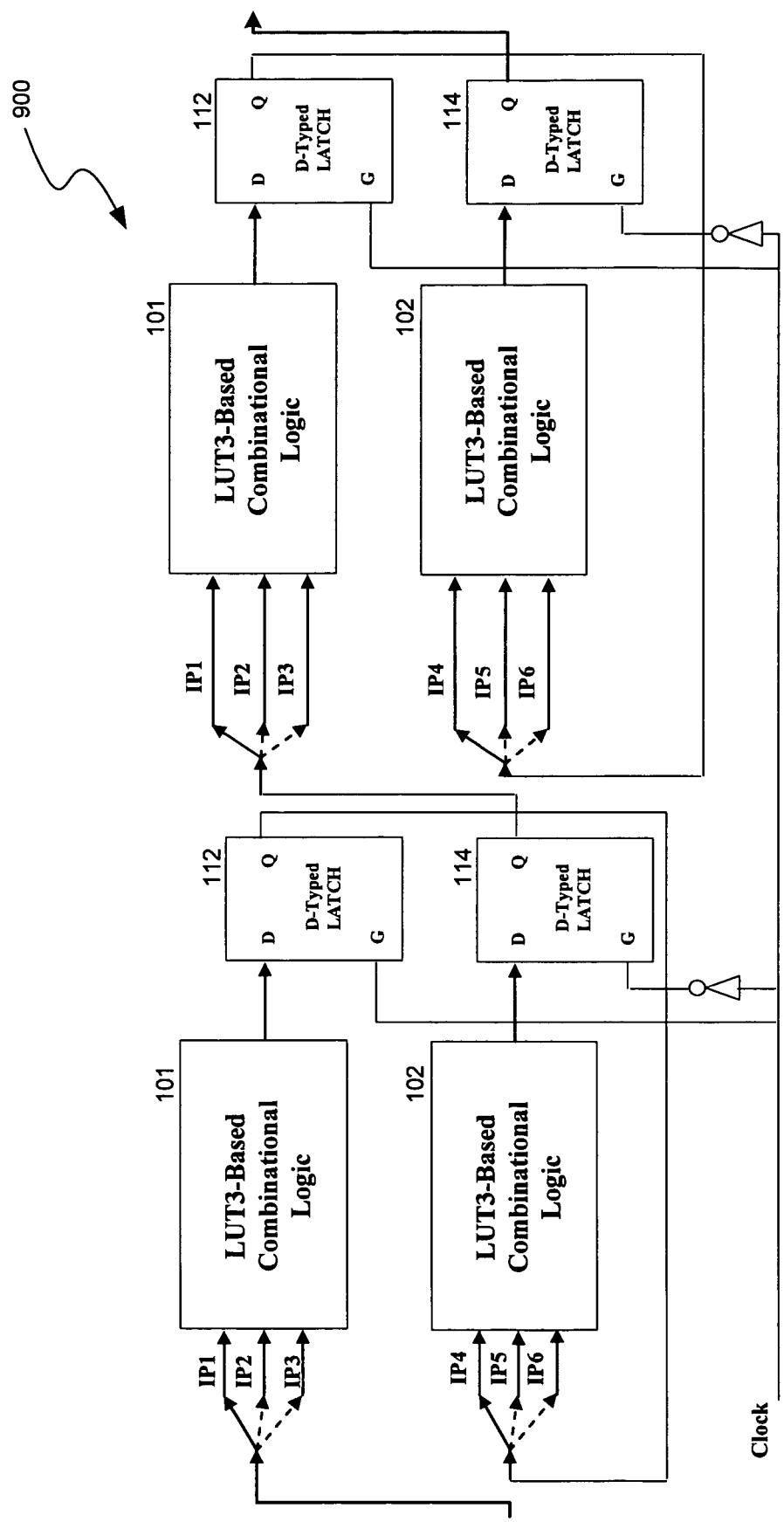
*FIG. 9* (Based on feed-back chain)

FAST PROCESSING PATH USING FIELD PROGRAMMABLE GATE ARRAY LOGIC UNITS

TECHNICAL FIELD

This invention relates to the general area of Field Programmable Gate Arrays (FPGA) In particular, it relates to the architecture of FPGA building blocks, arrays of modularized blocks, and their interconnection resources.

BACKGROUND

A digital logic circuit, generally formed as a cascade of separate logic functions, is a circuit that produces a digital output as a result of some logical operation on its digital inputs. Digital logic circuits are typically implemented on various types of integrated semiconductor chips. One widely known type of integrated chip is the Application Specific Integrated Circuit (ASIC), which is a custom-made integrated chip. Each ASIC is manufactured to implement a specific digital logic circuit.

Programmable chips are another type of integrated chips, but differ from ASICs because of their ability to implement any number of different complex digital logic circuits by configuring the underlying integrated chip. The programmable integrated chips are less costly, usually in a limited volume, than ASICs because a large number of similar integrated chips may be manufactured from a single design, which can later be configured to implement a wide variety of digital logic circuits. For this reason the cost of design and manufacturing is distributed over a large number of integrated chips.

An FPGA is one type of programmable integrated chips. The FPGA can either be permanently programmed by the user, such as in U.S. Pat. No. 4,758,745 by El Gamal, et al., or can be temporarily programmed by the user, as described in U.S. Pat. No. 4,870,302, by Freeman.

Typically, an FPGA consists of an array of modularized logic units and interconnection resources. It is an array of uncommitted gates with uncommitted wiring channels. Each logic unit can be programmed to implement a particular logic function. Various digital circuits may be implemented to execute desired functions by programming a number of logic blocks and interconnecting them using interconnection resources. In other words, to implement a particular circuit function, the circuit is mapped into the array and the wiring channels and appropriate connections are programmed to implement the necessary wiring connections that form the circuit function. A gate array circuit can be programmed to implement virtually any set of functions.

Of utmost importance in designing an FPGA is the topology of the logic units and the interconnection resources since different FPGA architecture provides different performance characteristics. Also, the programming of a gate array and the mapping of a desired functionality onto it depend upon the topology of the gate array. If the logic units of the gate array are high-level blocks, such as counters, parity generators, and the like, then the amount of programming required is limited to the interconnections among these large- or coarse-grain units.

If, on the other hand, the logic units of the gate array are low-level blocks, such as gates, latches, and the like, then the amount of programming is significantly higher, because these smaller, or fine-grain, units need to be interconnected to affect the higher-level functions. In some designs the use of the fine-grain units results in higher circuit densities because the desired functions can be implemented more efficiently with small low-level units rather than with larger high-level units whose high-level functionality is useless in the particular circumstances.

A highly complex logic unit may be able to perform a large number of complex operations, but if a relatively simple operation is desired, much of the functionality and semiconductor real estate will be wasted. At the same time, a logic unit consisting of basic logic gates requires extensive wiring to perform sophisticated operations. In other words, some complex designs cannot be efficiently embodied in a fine-grain gate array because the amount of interconnection required among the low-level units exceeds the capacity of the gate array.

The traditional implementations of the FPGA logic element units have predominantly focused on a single logic element producing a combinatorial function with arithmetic, sequential, and register packing capabilities. With such architecture, and in many applications, many of the capabilities of an FPGA logic element may remain unused. Various architectures have been proposed to optimize the tradeoffs among circuit building blocks, routing efficiency, performance limits, and the like. There is a need for logic units or a cluster of logic units that optimizes flexibility and functionality of the FPGAs.

BRIEF DESCRIPTION OF THE DRAWINGS

FIG. 1 is a schematic circuit diagram of an FPGA logic unit, in accordance with an embodiment of the invention.

FIG. 2 depicts a logic head while operating as a 4-input look-up table (LUT4), in accordance with another embodiment of the invention.

FIG. 3 depicts a logic head while operating as a LUT4 in a register packing mode, in accordance with another embodiment of the invention.

FIG. 4 depicts a logic head in a split combinational mode, in accordance with yet another embodiment of the invention.

FIG. 5 depicts a logic head in a split mode while employing D-latches, in accordance with yet another embodiment of the invention.

FIG. 6 illustrates a fast processing path configuration, wherein the logic head is in a split mode with D-latches, in accordance with an alternative embodiment of the invention.

FIG. 7 illustrates a fast processing path configuration, wherein the logic head is in a LUT4 mode with D-latches, in accordance with an alternative embodiment of the invention.

FIG. 8 illustrates a fast processing path configuration, wherein the logic head is in a split mode with combinational logic and D-latches, in accordance with another alternative embodiment of the invention.

FIG. 9 illustrates a fast processing path configuration, wherein the logic head is in a split mode with D-latches and both of the split parts are members of one path, in accordance with an alternative embodiment of the invention.

DETAILED DESCRIPTION

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

The described embodiments illustrate significant performance enhancement by split-mode dual combinatorial capabilities, combined synchronous control logic, independent and fully swappable outputs, dividable D flip-flop, and a fast data processing path based on such possibilities.

The present invention relates to the general area of Field Programmable Gate Arrays (FPGAs), and, in particular, to the architecture of the logic units that are the building blocks of the FPGAs, hereinafter called "logic heads," and the cascade of such logic heads. A cascade of the proposed logic heads does not require traditional channel-based routing resources and, as such, improves efficiency in several areas. In the detailed description provided below, different embodiments of the proposed logic head are disclosed, and some of their functional capabilities are illustrated. In addition, some of the advantages of cascading logic heads are described, and a few of the functional capabilities of such cascades will be presented.

In an embodiment illustrated in FIG. 1, a logic head 100, which is a function unit of an FPGA, comprises:

two 3-input look-up tables (LUT3): 101 and 102;
six inputs: IP1–IP6, where three of the inputs are shared between the two LUT3s;
four control signals: clock (CLK), synchronous reset (Syn_Rst), asynchronous reset (asynchronous_Rst), and synchronous load (Sload);
two outputs: OP1 and OP2;
two D-latches: 112 and 114;
two dynamic (standard) multiplexers: 107 and 108;
seven hard-wired (programmable) multiplexers: 103, 104, 105, 109, 110, 116, and 118;
one inverter: 111; and
a number of switches (not shown for clarity of the figures).

The LUT3 look-up tables are universal function generators and not necessarily limited to 3-inputs as shown in the logic diagrams. The two D-latches are triggered by opposite clock levels, and if combined together, they can form an edge-triggered D flip-flop. Without requiring channel-based or any external routing resources, required by most traditional FPGAs, a fast data processing path can be formed by directly linking the logic heads.

The logic function of each logic head is determined by the content of its look-up table and the appropriate routing of its internal signals. As illustrated by the embodiments of this invention, each logic head can operate in a split mode, and perform two separate functions in parallel or in series. Each logic head can also perform 2-bit arithmetic functions, and while in a cascading chain the logic heads perform multiple other functions. A cascading chain of logic heads improves logic efficiency in addition to significantly enhancing the performance without requiring traditional channel-based routing resources.

On the other hand, the logic units of most of the prior art FPGAs require 4-input look-up tables, dedicated carry logic, and multiple registers, which make them more complicated while performing the same or fewer functions. A few of the presently available commercial logic unit structures use 3-input look-up tables to implement logic functions, as indicated in U.S. Pat. No. 6,476,636 by Jung-Cheun Lien and U.S. Pat. No. 6,236,229 by Zvi Or-Bach. Also, regarding the cascading techniques, some prior arts include Altera's 10K family, which uses an AND gate, and Xilinx Virtex-architecture, which uses dedicated 2-to-1 multiplexers.

The embodiments of the present invention have expanded the flexibility of the logic units by, among other advantages, providing for split-mode dual combinatorial capabilities, which are supported by the two independent logic head outputs, and by the possibility of the formation of cascading logic chains, which employ dynamic multiplexers.

The two LUT3s of each logic head can implement a LUT4 with the help of a 2-to-1 dynamic multiplexer. The two LUT3s can also produce two LUT3s, two LUT2s, or one LUT3 and one LUT2, in parallel. The registered or the non-registered outputs of the two LUT3s, LUT2s, LUT4, or some of the inputs of the logic head can be routed to either of its two outputs, OP1 or OP2. Feeding back one or both of the outputs helps implement additional functionality such as counting, accumulating, finite state machines, or multi-level random logic. The provided D-latches, in addition to serving the logic head or its neighboring logic heads, may be used along with the D-latches of other logic heads to form a register chain.

In the following paragraphs, different embodiments of the invention will demonstrate how a logic head is programmed to implement any mentioned function. In the figures, the internal signal flow of the logic head, related to its function, is illustrated with a broken line. Based on these examples, and their associated figures, a person of ordinary skill in the relevant art will be able to program and configure such circuits and control or hard-wire, the multiplexers, to perform a desired function mentioned herein. (Hereinafter "hard-wiring" of a multiplexer will be referred to as "programming" the multiplexer.)

FIG. 2 depicts a logic head while operating as a 4-input look-up table (LUT4), in accordance with another embodiment of the invention. Each LUT3 101 and 102 has $2^3$ memory bits. The two of them together are capable of addressing $2(2^3)$ or $2^4$ data bits, which is the same as the number of possible combinations of a 4-input logic gate. Therefore, to use the logic head of FIG. 2 as a 4-input logic gate, IP1, IP2, IP3, and IP6 are chosen to be the inputs to the logic gate, and multiplexers 103, 104, and 105 are programmed so that LUT3s 101 and 102 both receive IP1, IP2, and IP3 as their inputs. In this way IP6 is used to control multiplexer 107 and choose between LUT3 101 and LUT3 102 outputs. In short, this arrangement makes $2^4$ memory bits available and addressable by IP1, IP2, IP3, and IP6, while each LUT3 can be used separately to implement 1-, 2-, or 3-input logic gates.

In the arrangement of FIG. 2, the desired outcome of all the logic combinations in which IP6=0 must be stored in one LUT3 and the ones with IP6=1 must be stored in the other LUT3. If the non-registered version of the output of multiplexer 107, which is effectively the output of the desired "4-input logic gate," is needed, it can be furnished at OP1 and/or OP2 by merely programming multiplexers 116 and/or 118, respectively.

If the registered version of the output of multiplexer 107 is desired, appropriate control of multiplexer 108, by Sload and Syn_Rst lines, routes the multiplexer 107 output to multiplexers 109 and 110 and from multiplexers 109 and 110, by appropriate programming, to D-latch 112 and/or 114. Programming of multiplexers 116 and/or 118 will make the latched outputs of D-latch 112 and/or 114 available at OP1 and/or OP2. Proper programming of multiplexers 109, 110, 116, and 118 will route the output of the D-latch 114 through the D-latch 112 before it appears at OP1 and/or OP2. With this arrangement the logic head is a LUT4 combined with a D flip-flop.

FIG. 3 depicts a logic head while operating as a LUT4 in a register packing mode, in accordance with another embodiment of the invention. In this embodiment the output of LUT4 may be available at OP1 and/or OP2 by programming multiplexers 116 and/or 118. The LUT4 output may also become available at OP1 and/or OP2 after going through the D flip-flop formed by D-latches 112 and 114, when multiplexers 108, 109, 110, 116, and 118 are appropriately controlled and programmed. In this embodiment the mentioned D flip-flop can be separately used by a signal entering the logic head at IP5 input, while the LUT4 is also independently utilized. Such separate usage of LUT4 and D flip-flop also requires programming of the same mentioned multiplexers.

FIG. 4 depicts a logic head in a split mode, with both of its LUT3s available in parallel as unregistered combinational logic. Using IP1, IP2, and IP3 as inputs to LUT3 101, and IP4, IP5, and IP6 as inputs to LUT3 102, both LUT3s can be employed separately, and by programming multiplexers 116 and 118, the outputs of LUT3 101 and LUT3 102 can be available at OP1 and OP2, respectively. The above explanation enables a person of ordinary skill in the appropriate art to also use either or both of the LUT3s as LUT2s.

FIG. 5 depicts a logic head in a split mode, with both of its LUT3s available in parallel, in latched form. In this embodiment, using IP1, IP2, and IP3 as inputs to LUT3 101, and IP4, IP5, and IP6 as inputs to LUT3 102, both LUT3s can be utilized separately. The output of LUT3 101 can be available at OP1 after going through multiplexer 109, D-latch 112, and multiplexer 116, while the output of LUT3 102 can be available at OP2 after going through multiplexer 110, D-latch 114, and multiplexer 118, if multiplexers 109, 110, 116, and 118 are appropriately programmed. The above explanation enables a person of ordinary skill in the appropriate art to also use either or both of the LUT3s as LUT2s.

The embodiment illustrated in FIG. 6 is an example of a fast processing path with two cascaded logic heads in a split mode, representing an $n^{th}$ and an $(n+1)^{th}$ stages of a cascade chain. Each stage of such chain latches the outputs of the corresponding two LUT3s for half a clock cycle. In the arrangement of FIG. 6, every other stage of the chain latches during every other half cycle of the clock. For example, stage n latches during the high-level half cycle of the clock (clock-high) and stage (n+1) latches during the low-level half cycle of the clock (clock-low).

The top row cascade chain of FIG. 6, comprising all 101 LUT3s, is functionally separate from the bottom row cascade chain, which comprises all 102 LUT3s. In this embodiment D-latch 112 switches its place with D-latch 114 from one stage to the next. For example, at stage n, LUT3 101 is in communication with D-latch 112 and LUT3 102 is in communication with D-latch 114, while at stage (n+1) LUT3 101 is in communication with D-latch 114 and LUT3 102 is in communication with D-latch 112.

In this embodiment the outputs of the two D-latches 112 and 114 of any stage can be connected to any of the three inputs of the corresponding LUT3 of the next stage. For example, the output of the D-latch 112 of stage n can be connected to IP1, IP2, or IP3 of the LUT3 101 of stage (n+1) and the output of the D-latch 114 of stage n can be connected to IP4, IP5, or IP6 of the LUT3 102 of stage (n+1). This embodiment is possible through appropriate programming of multiplexers 109, 110, 116, and 118.

In an alternative embodiment, similar to the one shown in FIG. 6, at every stage LUT3 101 remains in communication with D-latch 112 and LUT3 102 remains in communication with D-latch 114; however, the combination of LUT3 101 and D-latch 112 switches its place with the combination of LUT3 102 and D-latch 114 from one stage to the next. In this embodiment the output of the D-latch 112 of stage n can be connected to IP4, IP5, or IP6 of the LUT3 102 of stage (n+1) and the output of the D-latch 114 of stage n can be connected to IP1, IP2, or IP3 of the LUT3 101 of stage (n+1). This embodiment is possible through appropriate control and programming of multiplexers 109, 110, 116, and 118.

The embodiment illustrated in FIG. 7 is an example of a fast processing path with two cascaded logic heads each operating in LUT4 mode, representing an $n^{th}$ and an $(n+1)^{th}$ stages of a cascade chain. Each stage of such chain latches the outputs of the corresponding LUT4 for half a clock cycle. In the arrangement illustrated in FIG. 7, every other stage of the chain latches during every other half cycle of the clock. For example, stage n latches during the high-level half cycle of the clock (clock-high) and stage (n+1) latches during the low-level half cycle of the clock (clock-low).

In this embodiment every other stage uses D-latch 112 and the remaining in-between stages use D-latch 114. In this embodiment the output of the employed D-latch of any stage can be connected to any of the four inputs of the corresponding LUT4 of the next stage. For example, the output of the D-latch 112 of stage n shown in FIG. 6 can be connected to IP1, IP2, IP3, or IP6 of the LUT4 of stage (n+1). This embodiment is possible through appropriate programming of multiplexers 108, 109, and 118 at every other stage and 108, 110, and 118 at the remaining in-between stages.

FIG. 8 illustrates a fast processing path arrangement, similar to the one in FIG. 6, where LUT3s are replaced by any combinational logic and the logic heads, in effect, are used for their D-latches only. To use a logic head for its D-latches only, LUT3 101 can be programmed so that the output of the LUT3 101 follows one of its inputs, for example, IP1, and LUT3 102 can be programmed so that its output follows one of its inputs, for example, IP4. With such arrangement, the output of the combinational logics depicted in FIG. 8 can be tied to IP1 and IP4 and in effect the combinational logics replace the LUT3s. The multiplexer programming requirements of this embodiment are similar to those of the embodiments described in relation to FIG. 6.

In yet another embodiment shown in FIG. 9, both parts of a split logic head are members of the same cascade chain. The two parts of any logic head participating in the chain can either be consecutively arranged or reside separated from each other within the chain. FIG. 9 depicts two logic heads whose parts are consecutively arranged. One of the advantages of this embodiment is that most of the multiplexers of all logic heads are programmed the same and each logic head is fully utilized within the same chain.

In general, among other functions, a single or a cascade of logic heads can be utilized as:
a LUT4;
combinational logic and sequential elements used separately and simultaneously;
two LUT3, with or without latched outputs;
a 4-to-1 Multiplexer;
a 4-to-2 cross switch, where any one input of 4 can go to either of the two outputs;
multiple logic heads that can be chained to form:
a wide-input multiplexer;

a long register chain;

a long pipelined data path with the help of fast carry-chain;

a wide-input logic function, including random logic.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. When the claims use the word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, and U.S. patent application Ser. No. 10/883,901 filed Jul. 2, 2004, titled "LOGIC CELL FOR FIELD PROGRAMMABLE GATE ARRAY," AND U.S. patent application Ser. No. 10/916,232 filed Aug. 11, 2004, titled "FIELD PROGRAMMABLE GATE ARRAY LOGIC UNIT AND ITS CLUSTER," are incorporated herein by reference. Aspects of the invention can be modified, if necessary, to employ the systems, functions, and concepts of the various references described above to provide yet further embodiments of the invention.

Changes can be made to the invention in light of the above Detailed Description. While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as an embodied in computer-readable medium, other aspects may likewise be embodied in a computer-readable medium. Accordingly, the inventors reserve the right to add additional claims after filing the application to pursue such additional claim forms for other aspects of the invention.

We claim:

1. A field programmable gate array (FPGA) logic head, comprising:

two 3-input look-up tables, six data input ports, four control signals, two data output ports, two latches, two dynamic (standard) multiplexers, and seven hard-wired (programmable) multiplexers; and a configuration, wherein:

3-input look-up tables, in a split mode, are capable of being used as separate look-up tables, with or without latched outputs;

latches are capable of being used either as separate latches or as one flip-flop;

3-input look-up tables are capable of forming a 4-input look-up table, wherein the 4-input look-up table can be utilized separately, in connection with a latch, or in connection with a flip-flop;

a combination of a 3-input look-up table and a latch is capable of being utilized as a unit in a cascade chain of such units, where every other latch in the chain latches the output of its corresponding look-up table for one half of a clock cycle and the other latches of the chain latch the outputs of their corresponding look-up tables for the other half of the clock cycle;

a combination of the 4-input look-up table and a latch is capable of being utilized as a unit in a cascade chain of such units, where every other latch in the chain latches the output of its corresponding look-up table for one half of a clock cycle and the other latches of the chain latch the outputs of their corresponding look-up tables for the other half of the clock cycle; and a grouping of a combinational logic and a latch of the logic head is capable of being utilized as a unit in a cascade chain of such units, where every other latch in the chain latches the output of its corresponding combinational logic for one half of the clock cycle and the other latches of the chain latch the outputs of their corresponding combinational logic for the other half of the clock cycle.

2. The logic head of claim 1, wherein three of the data inputs are shared by the two 3-input look-up tables.

3. The logic head of claim 1, wherein the latches are two D-latches and each D-latch remains in latched mode at a different half cycle of the clock.

4. The logic head of claim 1, wherein the control signals are clock, synchronous reset, asynchronous reset, and synchronous load.

5. The logic head of claim 1, wherein each segment of a split logic head is a part of a separate cascade chain, or both segments of a split logic head are parts of a same cascade chain, and wherein the two split segments of any logic head, participating in the same chain, are capable of either being consecutively arranged or separated from each other within the chain.

6. A field programmable gate array (FPGA), comprising:

two n-input look-up tables, two registers, and multiple multiplexers; and a configuration, wherein:

n-input look-up tables, in a split mode, are capable of being used as separate combinatorial logic gates, with or without registered outputs;

registers are capable of being used separate from the look-up tables;

registers are capable of being used in combination to form a flip-flop;

the two n-input look-up tables are capable of forming one (n+1)-input look-up table, wherein the (n+1)-input look-up table can be utilized separately, in connection with a register, or in connection with the flip-flop;

a combination of an n-input look-up table and a register is capable of being utilized in a cascade chain of such combinations, where every other register in the chain stores the output of its corresponding look-up table for one half of a clock cycle and the other registers of the chain store the outputs of their corresponding look-up tables for the other half of the clock cycle; and a grouping of a combinational logic and a register of the logic head is capable of being utilized in a cascade chain of such groupings, where every other register in the chain stores the output of its corresponding combinational logic for one half of the clock cycle and the other registers of the chain store the outputs of their corresponding combinational logic for the other half of the clock cycle.

7. The FPGA of claim 6, wherein the registers are two D-latches and the flip-flop is a D flip-flop.

8. The FPGA of claim 6, wherein there are n to 2n inputs, n of which are capable of being shared by both n-input look-up tables, and wherein there are four control signals for clocking, asynchronous and synchronous resetting, and loading.

9. The FPGA of claim 6, wherein one of the two registers stores its input data at a high half cycle of the clock and the other stores its input data at a low half cycle of the clock.

10. The FPGA of claim 6, wherein one split part of the FPGA may be used in a registered mode and the other part in a non-registered mode.

11. The FPGA of claim 6, wherein the FPGA may be used for its look-up tables, for its registers, for its look-up tables and registers but separately, or for a combination of its look-up tables and registers.

12. The FPGA of claim 6, wherein each part of a split FPGA is a segment of a separate cascade chain, or both parts of the split FPGA are segments of a same cascade chain, and wherein the two parts of any FPGA participating in the same chain are capable of either being consecutively arranged or separated from each other.

13. The FPGA of claim 6, wherein a combination of the (n+1)-input look-up table and a register may be utilized in a cascade chain of such combinations, where every other (n+1)-input look-up table in the chain is connected to the register of the FPGA that is clocked by the high half cycle of the clock and the other (n+1)-input look-up tables in the chain are connected to the corresponding registers of the FPGAs that are clocked by the low half cycle of the clock.

14. A field programmable gate array (FPGA), comprising:
a means for functioning as two separate n-input combinatorial logic gates, as one (n+1)-input combinatorial logic gate, or as both;
a means for latching the outputs of the n-input combinatorial logic gates, the (n+1)-input combinatorial logic gate, or both;
a means for forming a flip-flop;
a means for operating is a split mode wherein the FPGA is partitioned into two separate n-input combinatorial logic gates that are capable of being utilized with or without latched outputs;
a means for utilizing the (n+1)-input combinatorial logic gate with or without latched output or in combination with the flip-flop; and
a means for latching the output of an n- or the (n+1)-input combinatorial logic gate for either of the two half cycles of a clock pulse.

15. The FPGA of claim 14, wherein the registers are two D-latches and the flip-flop is a D flip-flop.

16. The FPGA of claim 14, wherein there are n to 2n inputs, n of which are capable of being shared by the n-input look-up tables, and wherein there are four control signals for clocking, asynchronous and synchronous resetting, and loading.

17. The FPGA of claim 14, wherein one of the two latches stores its input data at a high half cycle of the clock and the other latch stores its input data at a low half cycle of the clock.

18. The FPGA of claim 14, wherein one split part of the FPGA may be used in a registered mode and the other part in a non-registered mode.

19. The FPGA of claim 14, wherein the FPGA may be used for its look-up tables, for its latches, for its look-up tables and latches but separately, or for a combination of its look-up tables and latches.

20. The FPGA of claim 14, wherein each part of a split FPGA is a segment of a separate cascade chain, or both parts of a split FPGA are segments of same cascade chain, and wherein the two parts of any FPGA participating in the same chain are capable of either being consecutively arranged or reside separated from each other within the chain.

* * * * *